US010516932B2

(12) United States Patent
Wang et al.

(10) Patent No.: US 10,516,932 B2
(45) Date of Patent: Dec. 24, 2019

(54) WIRE CONTROL EARPHONE

(71) Applicant: GOERTEK INC., Weifang, Shandong (CN)

(72) Inventors: Jianbo Wang, Weifang (CN); Xinfang Cao, Weifang (CN); Yongjiang Lu, Weifang (CN)

(73) Assignee: GOERTEK INC., Weifang, Shandong (CN)

( * ) Notice: Subject to any disclaimer, the term of this patent is extended or adjusted under 35 U.S.C. 154(b) by 0 days.

(21) Appl. No.: 16/304,584

(22) PCT Filed: Dec. 16, 2016

(86) PCT No.: PCT/CN2016/110298
§ 371 (c)(1),
(2) Date: Nov. 26, 2018

(87) PCT Pub. No.: WO2017/206481
PCT Pub. Date: Dec. 7, 2017

(65) Prior Publication Data
US 2019/0297409 A1 Sep. 26, 2019

(30) Foreign Application Priority Data
May 30, 2016 (CN) .......................... 2016 1 0374083

(51) Int. Cl.
*H04R 1/10* (2006.01)
*H04S 1/00* (2006.01)
*H03G 7/00* (2006.01)

(52) U.S. Cl.
CPC ........... *H04R 1/1041* (2013.01); *H03G 7/005* (2013.01); *H04S 1/005* (2013.01); *H04R 2430/01* (2013.01)

(58) Field of Classification Search
CPC ... H04R 1/1041; H04R 2430/01; H04S 1/005; H03G 7/005
(Continued)

(56) References Cited
U.S. PATENT DOCUMENTS
10,045,135 B2 * 8/2018 Weijand .............. H04R 1/1041

FOREIGN PATENT DOCUMENTS
CN 101662265 A 3/2010
CN 201699935 U 1/2011
(Continued)

*Primary Examiner* — Paul Kim
(74) *Attorney, Agent, or Firm* — Saliwanchik, Lloyd & Eisenschenk

(57) ABSTRACT

Disclosed is a wire control earphone, comprising a USB plug, an earphone wire, left and right ear receivers and a volume adjuster. The USB plug has a power-supply pin, a grounding pin and two signal pins. The earphone wire has a power-supply wire, two receiver wires and a ground wire which are correspondingly connected with the pins of the USB plug. The right ear receiver is connected between the right ear receiver wire and the ground wire. The volume adjuster is powered via the power-supply wire and comprises an adjustment triggering unit for outputting a volume adjustment signal, a processing unit for determining a voltage adjustment value according to the volume adjustment signal and outputting a digital voltage adjustment value, and a digital-to-analog conversion unit for converting the digital voltage adjustment value into an analog voltage adjustment value and applying the analog voltage adjustment value to the two receiver wires.

14 Claims, 5 Drawing Sheets

(58) Field of Classification Search
USPC .................................................. 381/74, 77
See application file for complete search history.

(56) References Cited

FOREIGN PATENT DOCUMENTS

| CN | 103118191 A | 5/2013 |
|----|-------------|--------|
| CN | 105979416 A | 9/2016 |

* cited by examiner

WIRE CONTROL EARPHONE

CROSS REFERENCE TO RELATED APPLICATIONS

This application is a National Stage of International Application No. PCT/CN2016/110298, filed on Dec. 16, 2016, which claims priority to Chinese Patent Application No. 201610374083.X, filed on May 30, 2016, both of which are hereby incorporated by reference in their entireties.

TECHNICAL FILED

The present disclosure relates to the technical field of wire control earphones, and in particular, to a wire control earphone capable of processing a volume adjustment request independently.

BACKGROUND ART

Existing wire control earphones have a conventional 3.5 mm interface, a USB interface, a Lighting interface and other forms of interfaces. All of these earphones can realize volume adjustment by key control. The principle of the volume adjustment is that a voltage of a corresponding connection wire is changed by pressing volume adjustment keys (including a volume increase key and a volume decrease key), so that a processor at one end of an electronic device adjusts the volume output according to the voltage change of the connection wire, that is, the volume adjustment is implemented by the electronic device.

A volume adjustment process in the prior art is illustrated by taking a wire control earphone with the 3.5 mm interface as an example. The wire control earphone comprises an earphone interface, left ear and right ear receivers, a microphone and a key panel, wherein the earphone interface is provided with left and right ear positive wires, a microphone wire and a ground wire, the positive terminal of the left ear receiver being connected to the left ear positive wire, and the negative terminal thereof to the ground wire, the positive terminal of the right ear receiver being connected to the right ear positive wire, and the negative terminal thereof to the ground wire, and the microphone being connected between the microphone wire and the ground wire. For example, if a start pause key, a volume increase key and a volume decrease key are arranged on the key panel, the start pause key is connected between the microphone wire and the ground wire to enable the microphone wire to acquire a low level when the start pause key is pressed. The volume increase key and a corresponding pull-up resistor are connected in series between the microphone wire and the ground wire. The pull-up resistor is configured to enable the microphone wire to acquire a level signal corresponding to a volume increase control instruction when the volume increase key is pressed, the level signal corresponding to the volume increase control instruction being usually set within the range of 80-120 mV. The volume decrease key and a corresponding pull-up resistor are connected in series between the microphone wire and the ground wire. The pull-up resistor is configured to enable the microphone wire to acquire a level signal corresponding to a volume decrease control instruction when the volume decrease key is pressed, the level signal corresponding to the volume decrease control instruction being usually set within the range of 180-220 mV. In this way, when a user presses the volume increase key once, the level signal corresponding to the volume increase control instruction is output by the microphone wire to the electronic device, and then, the electronic device correspondingly increases the volume according to the set correspondence. When the user presses the volume decrease key once, the level signal corresponding to the volume decrease control instruction is output by the microphone wire to a user terminal, and then, the electronic device correspondingly decreases the volume according to the set correspondence.

However, adjusting the volume through an electronic device will increase the load of a processor of the electronic device, such as a mobile phone, which inevitably affects the speed of the electronic device for processing other data, as well as the response speed of other functions of the electronic device. Therefore, it is very necessary to provide a wire control earphone capable of processing a volume adjustment request independently.

SUMMARY OF THE DISCLOSURE

An object of embodiments of the present disclosure is to provide a wire control earphone capable of processing a volume adjustment request independently.

According to a first aspect of the present disclosure, there is provided a wire control earphone, comprising: a USB plug, an earphone wire, left and right ear receivers, and a volume adjuster. The USB plug is provided with a power-supply pin, a grounding pin, and two signal pins. The earphone wire is provided with a power-supply wire connected with the power-supply pin, a ground wire connected with the grounding pin, a left ear receiver wire connected with one of the signal pins, and a right ear receiver wire connected with the other signal pin. The left ear receiver is connected between the left ear receiver wire and the ground wire. The right ear receiver is connected between the right ear receiver wire and the ground wire. The volume adjuster is powered by the power-supply wire, and comprises: an adjustment triggering unit configured to output a volume adjustment signal; a processing unit configured to determine a voltage adjustment value according to the volume adjustment signal and output a digital voltage adjustment value; and a digital-to-analog conversion unit configured to covert the digital voltage adjustment value into an analog voltage adjustment value and apply the analog voltage adjustment value to the left and right ear receiver wires.

Alternatively, the adjustment triggering unit is configured to output left and right ear volume adjustment signals respectively.

The processing unit is configured to determine a left ear voltage adjustment value according to the left ear volume adjustment signal and output a digital left ear voltage adjustment value, and determine a right ear voltage adjustment value according to the right ear volume adjustment signal and output a digital right ear voltage adjustment value.

The digital-to-analog conversion unit is configured to covert the digital left ear voltage adjustment value into an analog left ear voltage adjustment value and apply the analog left ear voltage adjustment value to the left ear receiver wire, and covert the digital right ear voltage adjustment value into an analog right ear voltage adjustment value and apply the analog right ear voltage adjustment value to the right ear receiver wire.

Alternatively, the digital-to-analog conversion unit is provided with two digital-to-analog converters, one of which is configured to perform a digital-to-analog conversion on the left ear voltage adjustment value, and the other of which is configured to perform a digital-to-analog conversion on the right ear voltage adjustment value.

Alternatively, the digital-to-analog converters adopted by the digital-to-analog conversion unit are bipolar digital-to-analog converters.

Alternatively, in addition to the digital-to-analog converters, the digital-to-analog conversion unit further comprises a negative voltage conversion circuit and single-pole double-throw analog switches corresponding to the digital-to-analog converters respectively.

The negative voltage conversion circuit is configured to convert a positive voltage provided via the power-supply wire into a negative voltage to be output.

Each single-pole double-throw analog switch comprises a first input end, a second input end, a common output end and a gate control end. The first input end is connected to the power-supply wire. The second input end is connected to a negative voltage output end of the negative voltage conversion circuit. The common output end is connected to a reference voltage input end of the corresponding digital-to-analog converter.

The processing unit is further configured to output a gate control signal for gating the first input end to the gate control end of the corresponding single-pole double-throw analog switch when a positive voltage adjustment value is output, and output a gate control signal for gating the second input end to the gate control end of the corresponding single-pole double-throw analog switch when a negative voltage adjustment value is output.

Alternatively, the adjustment triggering unit comprises adjustment components; each adjustment component and a corresponding pull-up resistor are connected in series between the power-supply wire and the ground wire. The adjustment triggering unit outputs a corresponding volume adjustment signal through a potential point between the adjustment component and the corresponding pull-up resistor.

Alternatively, the pull-up resistors are packaged inside a chip of the processing unit.

Alternatively, the adjustment components are sliding rheostats.

Alternatively, the volume adjuster further comprises an amplification unit configured to amplify the analog voltage adjustment value and apply the amplified voltage adjustment value to the corresponding receiver wire.

Alternatively, the volume adjuster is connected to the earphone wire, and comprises a housing and a circuit board packaged in the housing. Each unit of the volume adjuster is arranged on the circuit board. The adjustment component of the adjustment triggering unit is exposed through the housing.

The inventor of the present disclosure finds that the load of a processor of an electronic device is increased as the electronic device has to adjust the volume in the prior art. Therefore, the technical task to be achieved or the technical problem to be solved by the present disclosure is unintentional or unanticipated for those skilled in the art, and thus the present disclosure refers to a novel technical solution.

It is an advantageous effect of the present disclosure that the wire control earphone is provided with the volume adjuster which is capable of responding to a volume adjustment operation, then outputting an analog voltage adjustment amount, and applying the analog voltage adjustment amount to the corresponding receiver wire. Thus, a superimposed signal of the voltage adjustment amount and an audio signal output by the electronic device to the receiver wire is output to the corresponding receiver to realize audio output, so that the volume adjustment at a corresponding earphone end is realized. By using the wire control earphone provided by the present disclosure to adjust the volume, resources of the processor of the electronic device will not be occupied, so that the response speed of other functions of the electronic device is improved when an audio is played.

Further features of the present disclosure and advantages thereof will become apparent from the following detailed description of exemplary embodiments according to the present disclosure with reference to the accompanying drawings.

BRIEF DESCRIPTION OF THE DRAWINGS

The accompanying drawings, which are incorporated in and constitute a part of the description, illustrate embodiments of the present disclosure and, together with the description thereof, serve to explain the principles of the present disclosure.

Figure 1:
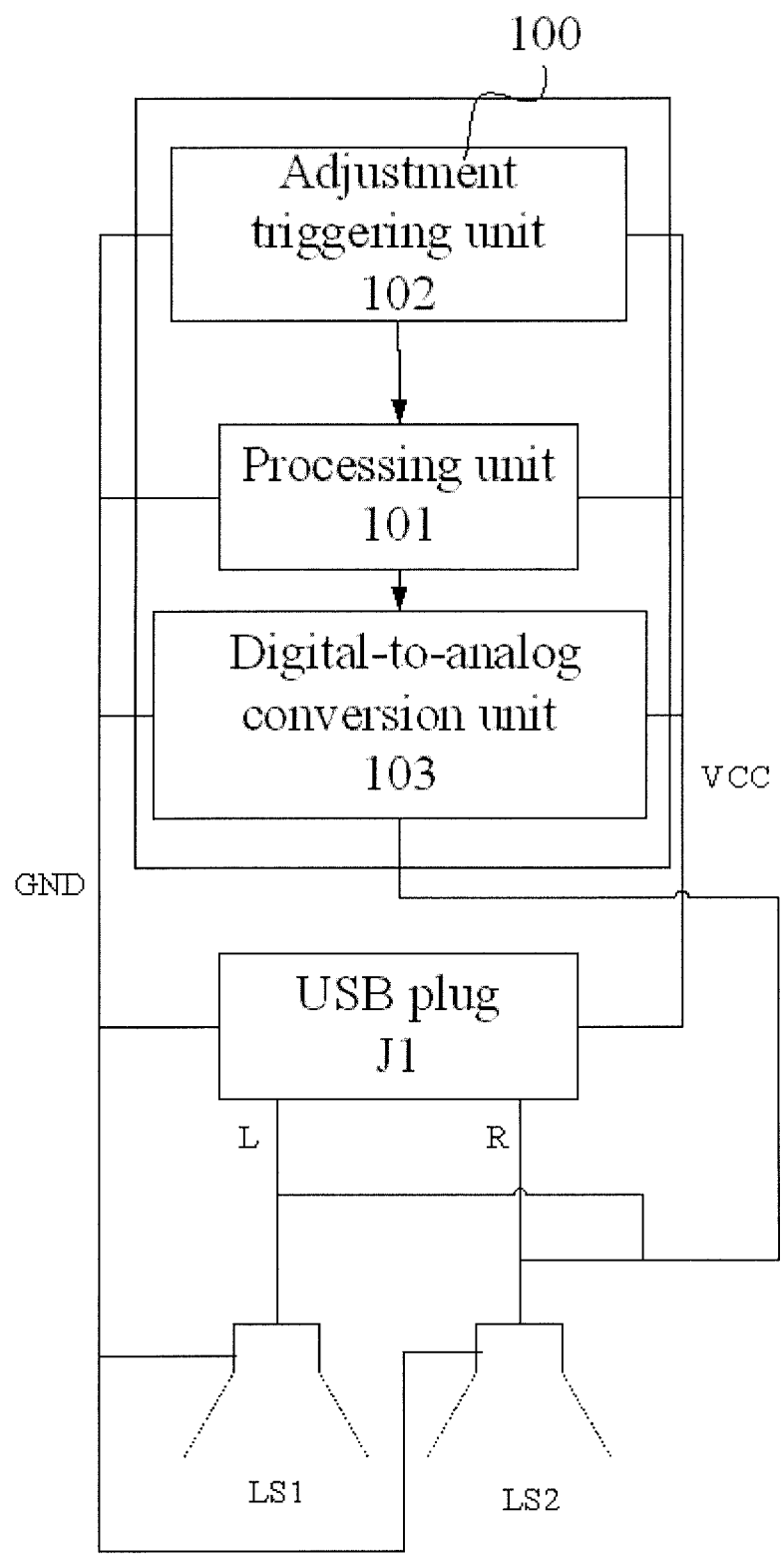
FIG. 1 is a block diagram of a wire control earphone according to an embodiment of the present disclosure.

Description of the reference numerals: 100, 200 and 300: volume adjuster; LS1: left ear receiver; LS2: right ear receiver; J1: USB plug; EL: earphone wire; SH: housing of volume adjuster; AE: adjustment component of adjustment triggering unit; 101, 201 and 301: processing unit; 102, 202 and 302: adjustment triggering unit; 204: amplification unit; 103, 203, 303: digital-to-analog conversion unit; VCC: power-supply wire; GND: ground wire; L: left ear receiver wire; R: right ear receiver wire; U2: chip of processing unit; DVCC: positive power-supply input end of chip U2; DVSS: grounding end of chip U2; P1.0-P1.7: IO pins of U2; P2.0-P2.5: IO pins of U2; U8: single-pole double-throw analog switch; −VX: negative voltage output end; L1: inductor; R2: sliding rheostat; SW2: switch; U3: digital-to-analog converter; VDD: positive power-supply input end of digital-to-analog converter; AGND: grounding end of digital-to-analog converter; SCLK: serial clock input end of digital-to-analog converter; $\overline{CS}$: chip selection pin; DIN: digital signal input end of digital-to-analog converter; OUTA: analog voltage output end A of digital-to-analog converter; OUTB: analog voltage output end B of digital-to-analog converter; REF: reference voltage input end of digital-to-analog converter; VCC-8: positive power-supply input end of single-pole double-throw analog switch; GND-8: grounding end of single-pole double-throw analog switch; IN1: gate control end of single-pole double-throw analog switch; NO1: first input end of single-pole double-throw analog switch; NC1: second input end of single-pole double-throw analog switch; and COM1: common output end of single-pole double-throw analog switch.

DETAILED DESCRIPTION OF THE EMBODIMENTS

Various exemplary embodiments of the present disclosure will now be described in detail with reference to the drawings. It should be noted that the relative arrangement of the components and steps, the numerical expressions, and numerical values set forth in these embodiments do not limit the scope of the present disclosure unless it is specifically stated otherwise.

The following description of at least one exemplary embodiment is merely illustrative in nature and is in no way intended to limit the disclosure, its application, or uses.

Techniques, methods and apparatus as known by one of ordinary skill in the relevant art may not be discussed in detail but are intended to be part of the description where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed in the accompanying drawings.

In order to solve the problem in the prior art that the response speed of other functions of an electronic device is affected as the resources of the electronic device with established connection are occupied in volume adjustment of an existing earphone, the present disclosure provides a wire control earphone capable of adjusting volume independently.

FIG. 1 is a block diagram of a wire control earphone according to an embodiment of the present disclosure.

As shown in FIG. 1, the wire control earphone provided by the present disclosure comprises a USB plug J1, an earphone wire, a left ear receiver LS1, a right ear receiver LS2 and a volume adjuster 100. The USB plug J1 may be a USB mini plug, a Type-C plug, a Lighting plug or the like, and is at least provided with a power-supply pin, a grounding pin and two signal pins. The earphone wire is provided with a power-supply wire VCC, a ground wire GND, a left ear receiver wire L and a right ear receiver wire R. The power-supply wire VCC is connected to the power-supply pin. The ground wire GND is connected to the grounding pin. The left ear receiver wire L is connected to one of the signal pins. The right ear receiver wire R is connected to the other signal pin. For example, the left ear receiver wire L is connected to the D+ signal pin of the USB, and the right ear receiver wire R is connected to the D− signal pin of the USB, so that an electronic device with established connection can transmit an audio signal to the receivers correspondingly through the two receiver wires to realize audio output.

The volume adjuster 100 is powered by the power-supply wire VCC. That is, all positive power-supply input ends of the volume adjuster 100 are connected to the power-supply wire VCC; and the grounding end of the volume adjuster 100 is connected to the ground wire GND.

The volume adjuster 100 comprises an adjustment triggering unit 102, a processing unit 101 and a digital-to-analog conversion unit 103. The adjustment triggering unit 102 is configured to output a volume adjustment signal according to an adjustment operation. The processing unit 101 is configured to acquire a voltage adjustment value according to the volume adjustment signal, and output a digital voltage adjustment value. The digital-to-analog conversion unit 103 is configured to convert the digital voltage adjustment value into an analog voltage adjustment value and apply the analog voltage adjustment value to the left ear receiver wire L and the right ear receiver wire R. Here, a converter of the digital-to-analog conversion unit 103 may be integrated inside a chip of the processing unit 101, or may be arranged independently. The chip of the processing unit 101 may be, for example, a single-chip microcomputer, an MCU, and the like having suitable processing capability.

It can be seen that in the wire control earphone provided by the present disclosure, the volume adjuster 100 can apply the voltage adjustment amount to the receiver wire according to a user's adjustment operation. Here, an audio signal received by the receiver is a superimposed signal of the voltage adjustment amount and an audio signal output by the electronic device, and the output volume of the receiver depends on the voltage of a received signal, so that the volume adjustment at the earphone end can be realized by outputting the voltage adjustment amount to superimpose signals.

As shown in FIG. 1, this embodiment adopts a structure that volume adjustment of the left ear receiver LS1 and the right ear receiver LS2 are performed simultaneously. Therefore, the adjustment triggering unit 102 outputs a uniform volume adjustment signal to the processing unit 101 according to the user's adjustment operation.

An adjustment triggering circuit of the adjustment triggering unit 102 may comprise adjustment components and pull-up resistors. The adjustment component and the corresponding pull-up resistor are connected in series between the power-supply wire VCC and the ground wire GND, so as to output a volume adjustment signal through a potential point between the pull-up resistor and the adjustment component.

Figure 4:
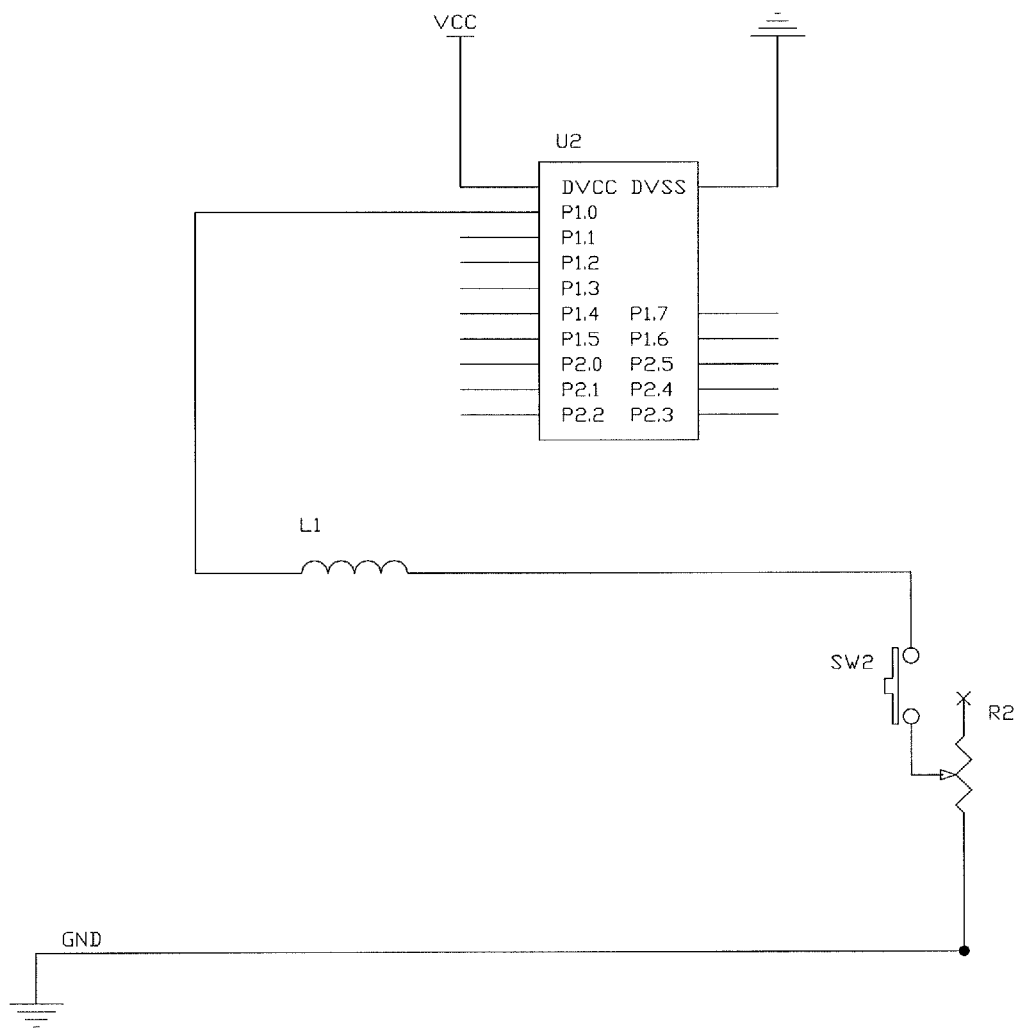
FIG. 4 is a circuit diagram of an implementation structure of a volume adjustment circuit shown in FIGS. 1-3.

FIG. 4 is a circuit diagram of an implementation structure of a volume adjustment circuit shown in FIG. 1.

As shown in FIG. 4, a pull-up resistor of the adjustment triggering circuit can be packaged inside the chip U2 of the processing unit 101. That is, the pin of the chip U2 for receiving the volume adjustment signal is connected to a power-supply input pin DVCC inside the chip U2 through one pull-up resistor, and the power-supply input pin DVCC is connected with the power-supply wire VCC. Therefore, there is no need to externally connect the pull-up resistor in the embodiment shown in FIG. 4.

As shown in FIG. 4, the adjustment component may be a sliding rheostat R2. The user can adjust a resistance value by pushing an adjustment terminal of the sliding rheostat R2 so as to adjust the volume adjustment signal input to the processing unit 101. In this way, the processing unit 101 can acquire a corresponding voltage adjustment value according to a current voltage value of the volume adjustment signal. For example, it is set that a voltage adjustment value corresponding to an intermediate resistance value is 0; a voltage adjustment value corresponding to a resistance value greater than the intermediate resistance value is greater than 0, the resistance value being proportional to the voltage adjustment value; and a voltage adjustment value corresponding to a resistance value smaller than the intermediate resistance value is smaller than 0, the resistance value being inversely proportional to the absolute value of the voltage adjustment value.

Here, the processing unit 101 may acquire a voltage adjustment value corresponding to a current voltage value according to a mapping relationship between the voltage value and the voltage adjustment value of the volume adjustment signal. The mapping relationship may be a formula or a comparison table. If it is the comparison table, the voltage adjustment value corresponding to the current voltage value can be determined in combination with the interpolation operation.

The sliding rheostat R2 may be provided with a switch SW2 so that the resistance can be adjusted once the adjustment triggering circuit is disconnected. After adjusting the resistance, the switch SW2 is closed by pressing an adjustment terminal so as to connect the sliding rheostat R2 to the circuit to trigger the volume control signal. Afterwards, the adjustment terminal is released and the switch SW2 is automatically reset so as to disconnect the adjustment triggering circuit to save energy.

For the sliding rheostat R2 with the switch SW2, the adjustment triggering circuit may further comprise an inductor L1 connected in series with the sliding rheostat R2 so as to store energy through the inductor L1.

The adjustment component may also adopt a self-reset key switch. In this way, the adjustment triggering unit 102 needs to be provided with two adjustment components to increase and decrease the volume, respectively. That is, every time when the adjustment component is pressed, the volume adjustment signal is triggered once; and the processing unit 101 adjusts a set volume amount once after receiving one volume adjustment signal. For example, every time when the adjustment component for increasing the volume is pressed, a positive volume adjustment signal is triggered once; and the processing unit 101 increases the output of the set amount on the basis of a current voltage adjustment amount. Here, the processing unit 101 may initialize the current voltage adjustment amount to zero each time when power is turned on.

The adjustment component may also be a touch screen, so that the volume adjustment signal can be triggered when a finger slides on the touch screen. For example, sliding to the right means volume increase, and sliding to the left means volume decrease.

The digital-to-analog conversion unit 103 may adopt a bipolar digital-to-analog converter to output a positive voltage adjustment value and a negative voltage adjustment value.

In addition, the digital-to-analog conversion unit 103 may also adopt a unipolar digital-to-analog converter to output positive and negative voltage adjustment values.

Figure 5:
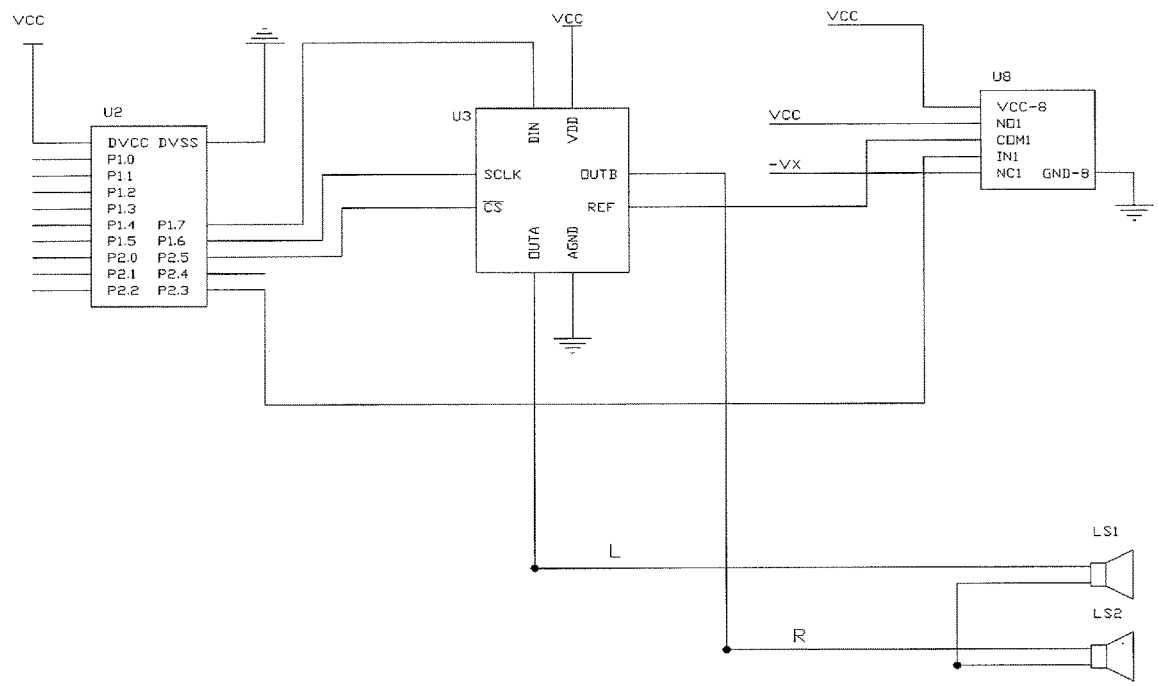
FIG. 5 is a circuit diagram of an implementation structure of a digital-to-analog conversion unit shown in FIGS. 1-3.

FIG. 5 is a circuit diagram of an implementation structure corresponding to the embodiment shown in FIG. 1 for outputting positive and negative voltage adjustment values by using a unipolar digital-to-analog converter.

As shown in FIG. 5, in addition to a digital-to-analog converter U3, the digital-to-analog conversion unit 103 further comprises a negative voltage conversion circuit (not shown in the figure) and a single-pole double-throw analog switch U8.

The negative voltage conversion circuit is configured to convert a positive voltage provided via the power-supply wire VCC into a negative voltage to be output. The negative voltage conversion circuit may adopt a positive-negative voltage conversion chip, for example, a TPS6375 chip, or may also adopt an inverted-phase proportional amplification circuit to output a specific negative voltage by selecting an amplifying ratio (which may be greater than, equal to, or smaller than 1).

The single-pole double-throw analog switch U8 comprises a first input end NO1, a second input end NC1, a common output end COM1 and a gate control end IN1. The first input end NO1 is connected to the power-supply wire VCC; the second input end NC1 is connected to a negative voltage output end –VX of a negative voltage conversion circuit; and the common output end COM1 is connected to a reference voltage input end REF of the digital-to-analog converter U3, The gate control end IN1 is configured to select an input end connected to the common output end COM1. For example, when the gate control end IN1 receives a high-level gate signal, the common output end COM1 is connected to the first input end NO1 to provide a positive reference voltage to the reference voltage input REF so as to output a positive voltage adjustment value. When the gate control end IN1 receives a low-level gate signal, the common output end COM1 is connected to the second input end NC1 to provide a negative reference voltage to the reference voltage input REF so as to output a negative voltage adjustment value.

In this way, the processing unit 101 is further configured to output a gate control signal for gating the first input end NO1, such as a high-level signal, to the gate control terminal IN1 when the positive voltage adjustment value is output, and output a gate control signal for gating the second input end NC1, such as a low-level signal, to the gate control terminal IN1 when the negative voltage adjustment value is output.

In the embodiment shown in FIG. 5, the chip U2 of the processing unit 101 outputs the above gate control signal through the pin P2.3.

In addition, the digital-to-analog converter of the digital-to-analog conversion unit 103 may be a single-channel output converter or a dual-channel output converter.

The digital-to-analog converter U3 in the embodiment shown in FIG. 5 is a dual-channel output converter to improve the load carrying capacity. The digital-to-analog converter U3 outputs two analog voltage adjustment values through an analog voltage output end A OUTA and an analog voltage output end B OUTB, respectively, so that the two analog voltage adjustment values are applied to two receiver wires, respectively. For example, the voltage adjustment value output through the analog voltage output end A OUTA is applied to the left ear receiver wire L; and the voltage adjustment value output through the analog voltage output end B OUTB is applied to the right ear receiver wire R.

Figure 2:
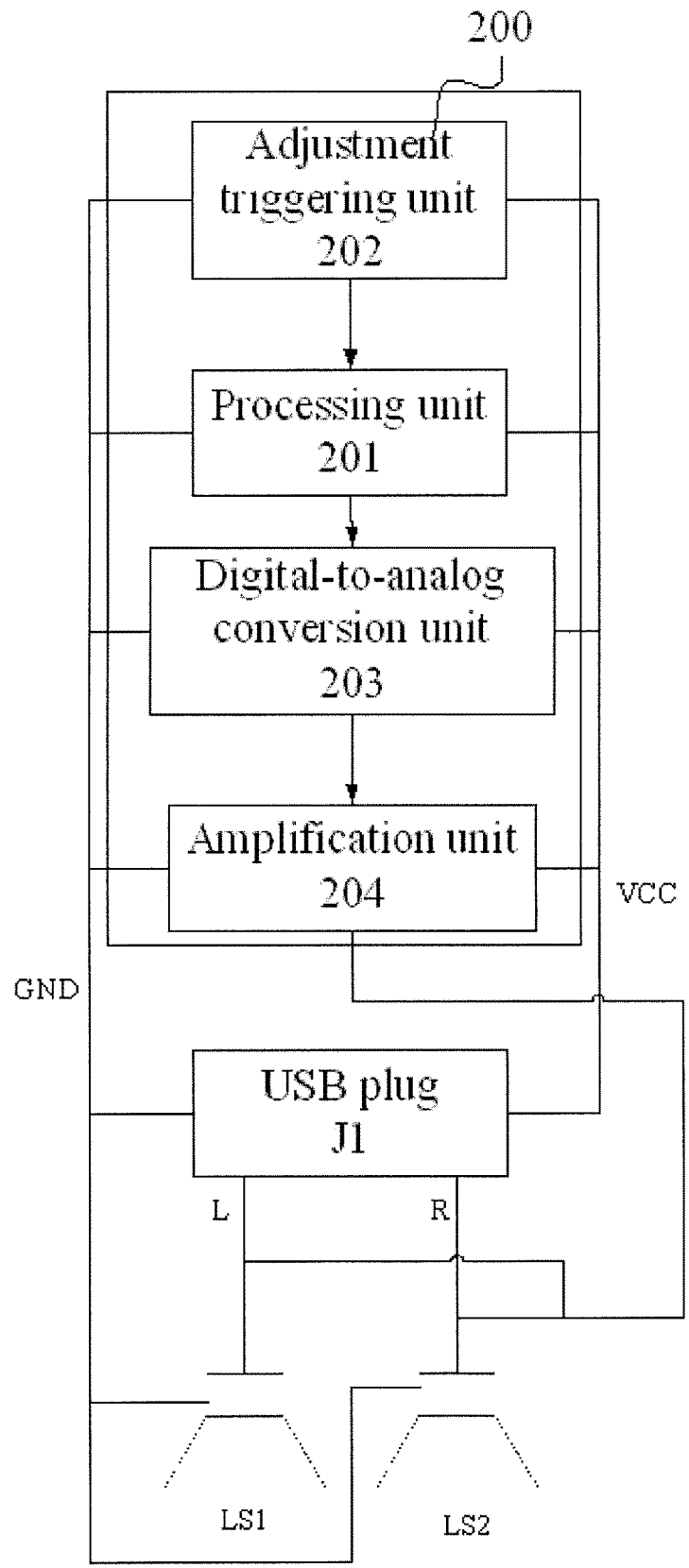
FIG. 2 is a block diagram of the wire control earphone according to another embodiment of the present disclosure.

FIG. 2 is a block diagram of a wire control earphone according to another embodiment of the present disclosure.

As shown in FIG. 2, the wire control earphone comprises a USB plug J1, an earphone wire, a left ear receiver LS1 and a right ear receiver LS2. This embodiment differs from the embodiment shown in FIG. 1 in that a volume adjuster 200 of the earphone can amplify a voltage adjustment value output from a digital-to-analog conversion unit 203 through an amplification unit 204, and can apply the amplified voltage adjustment value to two ear receiver wires L and R.

The structures and processing logics of an adjustment triggering unit 202, a processing unit 201, and the digital-to-analog conversion unit 203 in this embodiment and the corresponding units in the embodiment shown in FIG. 1 may be the same, and the details are not repeated here.

If the digital-to-analog converter 203 is a single-channel output digital-to-analog converter, the processing unit 204 may comprise an in-phase proportional operational amplification circuit to amplify an analog voltage adjustment value and apply the amplified voltage adjustment value to the two ear receiver wires L and R.

If the digital-to-analog converter 203 is a dual-channel output digital-to-analog converter, the processing unit 204 may comprise two in-phase proportional operational amplification circuits to amplify the analog voltage adjustment values, respectively, and apply the amplified voltage adjustment values to the two ear receiver wires L and R, respectively.

Figure 3:
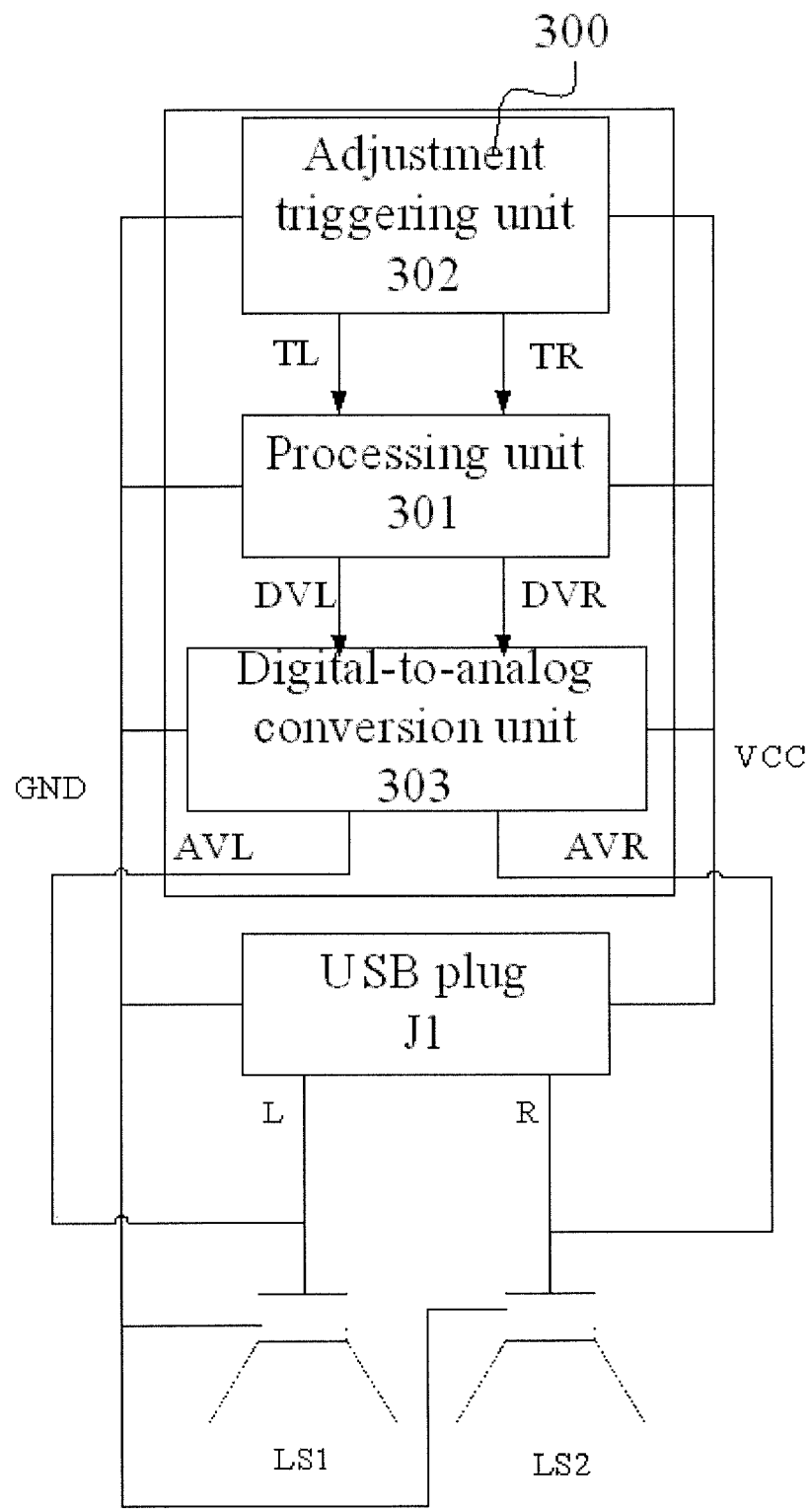
FIG. 3 is a block diagram of the wire control earphone according to a third implementation of the present disclosure.

FIG. 3 is a block diagram of a wire control earphone according to another embodiment of the present disclosure.

As shown in FIG. 3, the wire control earphone comprises a USB plug J1, an earphone wire, a left ear receiver LS1 and a right ear receiver LS2. This embodiment differs from the embodiment shown in FIG. 1 in that a volume adjuster 300 can adjust volumes of two receives of the earphone separately.

The volume adjuster 300 comprises an adjustment triggering unit 302, a processing unit 301 and a digital-to-analog conversion unit 303. The adjustment triggering unit 302 is configured to output a left ear volume adjustment signal TL and a right ear volume adjustment signal TR, respectively. The processing unit 301 is configured to acquire a left ear voltage adjustment value according to the left ear volume adjustment signal TL and output a digital left ear voltage adjustment value DVL, and acquire a right ear voltage adjustment value according to the right ear volume adjustment signal TR and output a digital right ear voltage adjustment value DVR. The digital-to-analog conversion unit 303 is configured to covert the digital left ear voltage adjustment value DVL into an analog left ear voltage adjustment value AVL and apply the analog left ear voltage adjustment value AVL to the left ear receiver wire L, and covert the digital right ear voltage adjustment value DVR to an analog right ear voltage adjustment value AVR and apply the analog right ear voltage adjustment value AVR to the right ear receiver wire R.

In this embodiment, the adjustment triggering unit 302 should comprise a portion corresponding to the volume adjustment of the left ear and a portion corresponding to the volume adjustment of the right ear. For example, if a sliding rheostat is taken as an adjustment component, the adjustment triggering unit 302 should comprise two adjustment triggering circuits as shown in FIG. 4.

The chip of the processing unit 301 needs different pins to receive the left ear volume adjustment signal TL and the right ear volume adjustment signal TR for distinguishing the signals.

The digital-to-analog conversion unit 303 may adopt two single-channel output digital-to-analog converters to realize digital-to-analog conversion of the left ear voltage adjustment value DVL and the right ear voltage adjustment value DVR through the two corresponding digital-to-analog converters, respectively.

Referring to the digital-to-analog conversion unit 103, the digital-analog conversion unit 303 may also adopt a bipolar digital-to-analog converter or a unipolar digital-to-analog converter in combination with a single-pole double-throw analog switch and a negative voltage conversion circuit to realize bipolar output.

When embodied as a unipolar digital-to-analog converter for example, the digital-to-analog conversion unit 303 should comprise two single-pole double-throw analog switches corresponding to the two digital-to-analog converters. Each single-pole double-throw analog switch and the corresponding digital digital-to-analog converter, the power-supply wire VCC and the negative voltage output end –VX of the negative voltage conversion circuit are connected by referring to the embodiment shown in FIG. 5. Thus, a chip of the processing unit 301 needs two pins to output gate control signals corresponding to the two single-pole double-throw analog switches, respectively.

Based on the embodiment shown in FIG. 3, if there is provided an amplification unit similar to that in the embodiment shown in FIG. 2, the amplification unit should comprise two in-phase proportional operational amplification circuits, wherein one operational amplification circuit is configured to amplify the left ear voltage adjustment value AVL and apply the amplified left ear voltage adjustment value to the left ear receiver wire L; and the other operational amplification circuit is configured to amplify the right ear voltage adjustment value AVR and apply the amplified right ear voltage adjustment value to the right ear receiver wire R.

Figure 6:
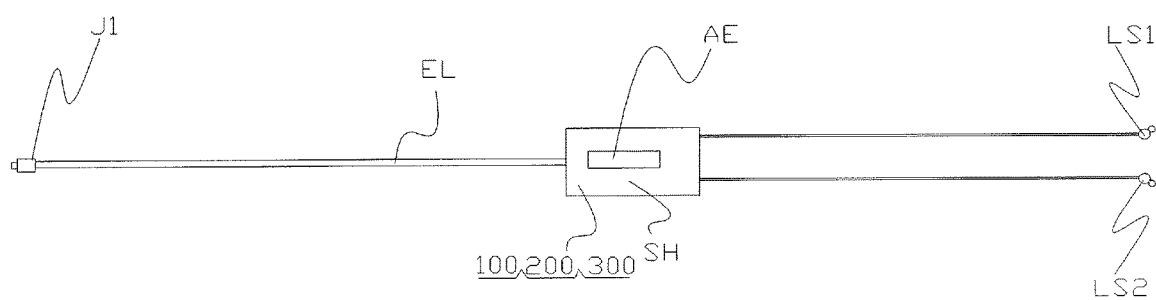
FIG. 6 is a block diagram of an overall structure of the wire control earphone according to an embodiment of the present disclosure.

FIG. 6 shows an overall appearance structure of a wire control earphone according to the present disclosure.

As shown in FIG. 6, the volume adjuster 100, 200 or 300 is connected to the earphone cord EL, and comprises a housing SH and a circuit board (not shown in the figure) packaged in the housing SH. All units of the volume adjuster 100, 200 or 300 are arranged on the circuit board. The adjustment component AE of the adjustment triggering unit 102, 202 or 303 is exposed through the housing SH to enable the user to adjust the volume through the adjustment component.

In addition, the left ear receiver LS1 and the right ear receiver LS2 of the wire control earphone can be led outward through the volume adjuster 100, 200 or 300. That is, the volume adjuster 100, 200 or 300 also plays a role of a splitter.

The above embodiments mainly focus on differences from other embodiments, and the same or similar parts among the embodiments may refer to each other.

Although some specific embodiments of the present disclosure have been demonstrated in detail with examples, it should be understood by a person skilled in the art that the above examples are only intended to be illustrative but not to limit the scope of the present disclosure. It should be understood by those skilled in the art that the above embodiments can be modified without departing from the scope and spirit of the present disclosure. The scope of the present disclosure is defined by the appended claims.

What is claimed is:

1. A wire control earphone, comprising a USB plug, an earphone wire, left and right ear receivers, and a volume adjuster, wherein the USB plug is provided with a power-supply pin, a grounding pin, and two signal pins, the earphone wire is provided with a power-supply wire connected with the power-supply pin, a ground wire connected with the grounding pin, a left ear receiver wire connected with one of the signal pins, and a right ear receiver wire connected with the other signal pin, the left ear receiver is connected between the left ear receiver wire and the ground wire, the right ear receiver is connected between the right ear receiver wire and the ground wire, and the volume adjuster is powered via the power-supply wire and comprises:

an adjustment triggering unit configured to output a volume, adjustment signal;

a processing unit configured to acquire a voltage adjustment value according to the volume adjustment signal and output a digital voltage adjustment value; and a digital-to-analog conversion unit configured to covert the digital voltage adjustment value into an analog voltage adjustment value and apply the analog voltage adjustment value to the left and right ear receiver wires;

wherein the digital-to-analog conversion unit comprises digital-to-analog converters, a negative voltage conversion circuit and single-pole double-throw analog switches corresponding to the digital-to-analog converters respectively;

the negative voltage conversion circuit is configured to convert a positive voltage provided via the power-supply wire into a negative voltage to be output;

each single-pole double-throw analog switch comprises a first input end, a second input end, a common output end and a gate control end, the first input end being connected to the power-supply wire, the second input end being connected to a negative voltage output end of the negative voltage conversion circuit, the common output end being connected to a reference voltage input end of the corresponding digital-to-analog converter; and the processing unit is further configured to output a gate control signal for gating the first input end to the gate control end of the corresponding single-pole double-throw analog switch when a positive voltage adjustment value is output, and output a gate control signal for gating the second input end to the gate control end of the corresponding single-pole double-throw analog switch when a negative voltage adjustment value is output.

2. The wire control earphone of claim 1, wherein the adjustment triggering unit is configured to output left and right ear volume adjustment signals respectively;

the processing unit is configured to acquire a left ear voltage adjustment value according to the left ear volume adjustment signal and output a digital left ear voltage adjustment value, and acquire a right ear voltage adjustment value according to the right ear volume adjustment signal and output a digital right ear voltage adjustment value; and the digital-to-analog conversion unit is configured to covert the digital left ear voltage adjustment value into an analog left ear voltage adjustment value and apply theanalog left ear voltage adjustment value to the left ear receiver wire, and covert the digital right ear voltage adjustment value into an analog right ear voltage adjustment value and apply the analog right ear voltage adjustment value to the right ear receiver wire.

3. The wire control earphone of claim 2, wherein the digital-to-analog conversion unit is provided with two digital-to-analog converters, one of which is configured to perform a digital-to-analog conversion on the left ear voltage adjustment value, and the other of which is configured to perform a digital-to-analog conversion on the right ear voltage adjustment value.

4. The wire control earphone of claim 1, wherein the digital-to-analog conversion unit comprises a digital-to-analog converter which is a bipolar digital-to-analog converter.

5. The wire control earphone of claim 1, wherein the adjustment triggering unit comprises at least one adjustment component, each adjustment component and a corresponding pull-up resistor being connected in series between the power-supply wire and the ground wire, and the adjustment triggering unit outputs the volume adjustment signal through a potential point between the at least one adjustment component and the corresponding pull-up resistor.

6. The wire control earphone of claim 5, wherein the pull-up resistors are packaged inside a chip of the processing unit.

7. The wire control earphone of claim 5, wherein the adjustment components are sliding rheostats.

8. The wire control earphone of claim 1, wherein the volume adjuster further comprises an amplification unit configured to amplify the analog voltage adjustment value and apply the amplified voltage adjustment value to the corresponding receiver wires.

9. The wire control earphone of claim 1, wherein the volume adjuster is connected to the earphone wire and comprises a housing and a circuit board packaged in the housing, each unit of the volume adjuster being arranged on the circuit board, and the adjustment component of the adjustment triggering unit is exposed through the housing.

10. The wire control earphone of claim 3, wherein the digital-to-analog converters are bipolar digital-to-analog converters.

11. The wire control earphone of claim 2, wherein the digital-to-analog conversion unit comprises digital-to-analog converters, a negative voltage conversion circuit and single-pole double-throw analog switches corresponding to the digital-to-analog converters respectively;

the negative voltage conversion circuit is configured to convert a positive voltage provided via the power-supply wire into a negative voltage to be output;

each single-pole double-throw analog switch comprises a first input end, a second input end, a common output end and a gate control end, the first input end being connected to the power-supply wire, the second input end being connected to a negative voltage output end of the negative voltage conversion circuit, the common output end being connected to a reference voltage input end of the corresponding digital-to-analog converter; and the processing unit is further configured to output a gate control signal for gating the first input end to the gate control end of the corresponding single-pole double-throw analog switch when a positive voltage adjustment value is output, and output a gate control signal for gating the second input end to the gate control end of the corresponding single-pole double-throw analog switch when a negative voltage adjustment value is output.

12. The wire control earphone of claim 2, wherein the adjustment triggering unit comprises at least one left ear adjustment component and at least one right ear adjustment component; each adjustment component and a corresponding pull-up resistor being connected in series between the power supply wire and the ground wire, and the adjustment triggering unit outputs the left ear volume adjustment signal through a potential point between the at least one left ear adjustment component and the corresponding pull-up resistor, and outputs the right ear volume adjustment signal through a potential point between the at least one right ear adjustment component and the corresponding pull-up resistor.

13. The wire control earphone of claim 2, wherein the volume adjuster further comprises an amplification unit configured to amplify the analog left ear voltage adjustment value and apply the amplified left ear voltage adjustment value to the left ear receiver wire, and amplify the analog right ear voltage adjustment value and apply the amplified right ear voltage adjustment value to the right ear receiver wire.

14. The wire control earphone of claim 2, wherein the volume adjuster is connected to the earphone wire and comprises a housing and a circuit board packaged in the housing, each unit of the volume adjuster being arranged on the circuit board, and the adjustment component of the adjustment triggering unit is exposed through the housing.

* * * * *